US012651699B2

(12) United States Patent (10) Patent No.: US 12,651,699 B2
Vinnichenko et al. (45) Date of Patent: Jun. 9, 2026

(54) METHOD FOR PRODUCING A PRINTED MAGNETIC FUNCTIONAL ELEMENT, AND PRINTED MAGNETIC FUNCTIONAL ELEMENT

(71) Applicant: Fraunhofer-Gesellschaft zur Förderung der Angewandten Forschung E.V., Munich (DE)

(72) Inventors: Mykola Vinnichenko, Dresden (DE); Nikolai Trofimenko, Dresden (DE); Viktar Sauchuk, Dresden (DE); Sindy Mosch, Dresden (DE); Marco Fritsch, Dresden (DE); Mihails Kusnezoff, Dresden (DE); Jens-Ingolf Mönch, Frietal (DE); Denys Makarov, Dresden (DE); Gilbert Santiago Canon Bermudez, Dresden (DE)

(73) Assignee: Fraunhofer-Gesellschaft zur Förderung der Angewandten Forschung E.V., Munich (DE)

( * ) Notice: Subject to any disclaimer, the term of this patent is extended or adjusted under 35 U.S.C. 154(b) by 1158 days.

(21) Appl. No.: 17/633,599

(22) PCT Filed: Aug. 7, 2020

(86) PCT No.: PCT/EP2020/072231
§ 371 (c)(1),
(2) Date: Feb. 8, 2022

(87) PCT Pub. No.: WO2021/028334
PCT Pub. Date: Feb. 18, 2021

(65) Prior Publication Data
US 2022/0310322 A1 Sep. 29, 2022

(30) Foreign Application Priority Data
Aug. 9, 2019 (DE) .................... 10 2019 211 970.0

(51) Int. Cl.
*H01F 41/30* (2006.01)
*B29C 64/112* (2017.01)
(Continued)

(52) U.S. Cl.
CPC ............ *H01F 41/30* (2013.01); *B29C 64/112* (2017.08); *B33Y 10/00* (2014.12); *B33Y 70/00* (2014.12);
(Continued)

(58) Field of Classification Search
CPC ........ H01F 41/14; H01F 41/16; H01F 41/205; H01F 41/22; H01F 41/24; H01F 41/30;
(Continued)

(56) References Cited

U.S. PATENT DOCUMENTS

2007/0178229 A1 8/2007 Bergendahl et al.
2009/0047485 A1 2/2009 Ofir et al.
(Continued)

FOREIGN PATENT DOCUMENTS

CN 102473503 A * 5/2012 ............. B82Y 25/00
CN 105036057 A 11/2015
(Continued)

OTHER PUBLICATIONS

China National Intellectual Property Administration, Office Action in Application No. CN202080055787.5, dated Nov. 15, 2024, 19 pages.
(Continued)

*Primary Examiner* — Hung D Nguyen
(74) *Attorney, Agent, or Firm* — Marshall & Melhorn, LLC

(57) ABSTRACT

A method for producing a printed magnetic functional element, in which a substrate is provided on one surface with at least one contact made of an electrically conductive material. Subsequently, a structure made of a material which
(Continued)

has a magnetoresistive effect and is in the form of a paste, a gel, a dispersion or a suspension is printed on or onto the at least one contact and touches the contact directly, and the structure becomes electrically conductive and sensitive to magnetic fields by irradiation with electromagnetic radiation over a time period in the millisecond range.

6 Claims, 1 Drawing Sheet

(51) Int. Cl.
| | |
|---|---|
| *B33Y 10/00* | (2015.01) |
| *B33Y 70/00* | (2020.01) |
| *B33Y 80/00* | (2015.01) |
| *H01F 7/06* | (2006.01) |
| *H01F 13/00* | (2006.01) |
| *H10N 50/85* | (2023.01) |

(52) U.S. Cl.
CPC ................ *B33Y 80/00* (2014.12); *H01F 7/06* (2013.01); *H01F 13/00* (2013.01); *H10N 50/85* (2023.02)

(58) Field of Classification Search
CPC ...... H01F 41/301; H01F 41/308; H01F 41/32; H01F 13/00; H01F 7/06; H10N 50/01; H10N 50/10; H10N 50/85; B33Y 70/00; B33Y 10/00; B33Y 80/00; B29C 64/112; B29C 64/153; B29C 64/218; B29C 64/264; B29C 64/268
See application file for complete search history.

(56) References Cited

U.S. PATENT DOCUMENTS

| | | | |
|---|---|---|---|
| 2011/0151587 A1 | 6/2011 | Huber | |
| 2012/0326714 A1* | 12/2012 | Karnaushenko | H01F 41/18 |
| | | | 324/252 |
| 2017/0062691 A1 | 3/2017 | Kirihara et al. | |
| 2017/0341183 A1* | 11/2017 | Buller | B22F 10/66 |
| 2018/0286940 A1 | 10/2018 | Peng et al. | |

FOREIGN PATENT DOCUMENTS

| | | | | |
|---|---|---|---|---|
| WO | 2016094827 A1 | 6/2016 | | |
| WO | WO-2019177535 A1 * | 9/2019 | ........... | H05K 3/1283 |

OTHER PUBLICATIONS

Makarov Denys et al., Shapeable magnetoelectronics, Applied Physics Reviews—Focused Review, American Institute of Physics, vol. 3, No. 1, Jan. 12, 2016, Mellville NY.
European Patent Office, International Search Report and Written Opinion in Application No. PCT/EP2020/072231, dated, Oct. 29, 2020, Rijswijk Netherlands.

\* cited by examiner (a)                                   (b)

METHOD FOR PRODUCING A PRINTED MAGNETIC FUNCTIONAL ELEMENT, AND PRINTED MAGNETIC FUNCTIONAL ELEMENT

FIELD

The present invention relates to a method for producing a printed magnetic functional element and a printed magnetic functional element.

BACKGROUND

Producing magnetoresistance sensors using wet chemical processes is an attractive approach that promises cost advantages compared to vacuum-based thin-film technologies, offers mechanical flexibility when printing on film substrates and facilitates integration into existing or new types of measurement systems. A disadvantage of such methods, however, is that the materials or applied printing layers used for printing often have to be laboriously dried in the oven for a long time and, optionally, sintered until the printed structure is functional. This classic approach, that is, a combination of printing with oven treatment does not work with most magnetoresistive (MR) materials, which is why there are only a few examples of printed magnetic field sensors so far.

For example, the document US 2012/0326714 A1 discloses a method for producing such sensors, in which the giant magnetoresistance effect (GMR) is used. Here, the material system is applied to a substrate by means of physical vapor deposition, then removed therefrom, ground in a controlled manner and processed into a printable paste. A working GMR sensor is obtained after printing said paste and drying it. In addition to the complicated processing of the paste itself, the lack of scalability due to the costs of producing a ground powder is disadvantageous.

SUMMARY

The present invention is therefore based on the object of proposing a method which avoids the disadvantages mentioned, with which a magnetic functional element can be produced simply and efficiently.

This object is achieved according to the invention by a method according to the main claim and a corresponding functional element according to the independent claim. Advantageous configurations and developments are described in the dependent claims.

In a method for producing a printed magnetic element, a substrate is provided on a surface having at least one contact made of an electrically conductive material. A structure arranged below, above and/or next to the contact is printed on or onto the at least one contact and directly touching it, which structure is present as a paste, gel, dispersion or suspension and comprises a material that has a magnetoresistive effect. The contact and/or the structure is then functionalized by irradiation with electromagnetic radiation over a period in the millisecond range and becomes electrically conductive and sensitive to magnetic fields, that is, that the entire structure or at least individual parts thereof have a magnetoresistive effect, at least by forming a mechanical connection between individual particles of the electrically conductive material and/or the material having a magnetoresistive effect. It can also be provided that the functionalization of the structure is carried out in two steps: First, drying and then irradiation with electromagnetic radiation over a period of time in the millisecond range, which causes sintering, pyrolysis, decomposition of organic components and/or removal of surface oxides. The material exhibiting a magnetoresistive effect is selected from bismuth, indium, antimony, iron, nickel, cobalt or an alloy of the elements mentioned or contains bismuth, indium, antimony, iron, nickel, cobalt or an alloy of the elements mentioned. The structure and the contact can be applied such that first the contact is applied to the surface of the substrate and then the structure is applied and such that the structure is produced first and then the contact. In the last-mentioned case, the at least one contact is thus possibly only in indirect touch contact with the surface of the substrate and the structure is in direct touching contact with the surface. The mechanical connection is to be understood to mean the formation of permanent, direct contact between the particles, for example, by means of a sintered bridge.

Functionalization by means of irradiation with electromagnetic radiation, which enables the electrical conductivity and the magnetoresistive effect to occur, enables the structure to be provided with the desired properties significantly faster than with conventional methods. Printing the structure also enables the desired arrangement to be produced quickly and inexpensively. In addition, adhesion to the substrate, for example, by local partial melting of a surface of the substrate, is improved without affecting the magnetic and electrical properties. An electrically conductive material is to be understood to mean a material whose electrical conductivity is at least $10^3$ S/m at room temperature. The magnetoresistive effect (MR effect) in the context of this document is intended to describe an effect in which an electrical resistance of the respective material changes when a magnetic field is applied to direct current and/or alternating current (magnetoimpedance). In particular, the usual magnetoresistive effect (ordinary magnetoresistive effect, OMR, without ferromagnetic ordering), the anisotropy magnetoresistance effect (AMR effect), the giant magnetoresistance effect (GMR effect), the colossal magnetoresistive effect (CMR effect), the tunnel magnetoresistance effect (TMR effect) and the planar Hall effect is to be understood here. In addition, changes in the electrical resistance of the material due to a normal and/or an anomalous Hall effect should also fall under this. Alternatively or additionally, the structure and/or the contact can also be dried in an oven and then irradiated with the electromagnetic radiation so that the corresponding material becomes electrically conductive immediately after drying and the subsequent irradiation in the millisecond range enables further improvement of the electrical conductivity or the magnetoresistive properties. In this case, a gel is to be understood as meaning, in particular, a disperse system consisting of at least two components, one of the components in liquid form and the other component in solid form at room temperature, that is, 20° C., and forming a spongy, three-dimensional network. A paste is to be understood in particular as a suspension which is no longer flowable and which has a high solids content, typically more than 10 percent by weight. In the context of this document, a structure is to be understood as meaning, in particular, a layer having a defined outer contour which is typically applied in a single process step and is preferably formed in a single layer, that is, consisting only of a single layer.

The period of time in the millisecond range in which the irradiation takes place can be between 0.1 ms and 100 ms. This period of time is preferably between 0.5 ms and 2 ms, particularly preferably exactly 2 ms. In this way, sufficient energy is applied over a short period of time, which at the same time makes the cycle rate of the manufacturing process sufficiently high so that this method is also suitable for roll-to-roll production. The structure can have a thickness of up to 100 μm, but is typically applied with a thickness of up to 10 μm. The at least one contact can also be applied with a thickness of up to 10 μm.

The electromagnetic radiation is typically irradiated with laser radiation, preferably diode laser radiation, and/or irradiation using a flash lamp in order to produce the desired effects quickly and inexpensively. In the case of laser radiation, for example, a near-infrared spectral range can be used (that is, a laser radiation source which emits laser radiation having a wavelength from the wavelength spectrum between 700 nm and 2000 nm). A radiation intensity can be in the range of a few $kW/cm^2$, typically in the range of no more than 50 $kW/cm^2$. In the case of flashlamp processing, a spectral range from near ultraviolet to near infrared can be used, that is, a wavelength range from 300 nm to 2000 nm. The power used corresponds to the radiation intensity of typically 1-30 $kW/cm^2$ used for a laser treatment.

The at least one contact made of an electrically conductive material is applied by at least one printing process, gas phase deposition or lamination of the contact. However, the printing process is preferred. Process steps of the same type as possible can be carried out in order to increase process efficiency. The at least one contact can be configured as an electrical conductor track here.

To print the structure, a gel, paste, dispersion or suspension is typically produced from a powder containing at least one metallic, semi-metallic or semiconducting material (which has the magnetoresistive effect), a dispersant having a polymer and/or a binder. The mean particle size of the powder containing metallic, semi-metallic or semiconducting material is preferably between 10 nm and 100 μm, particularly preferably between 100 nm and 10 μm.

Either aqueous or non-aqueous formulations can be used with regard to suitable surfactants for stabilizing the particles. Ionic, electrosteric or steric surfactants are preferably used for aqueous printing formulations. These are, in particular, acidic or basic functionalized polymers, preferably those having polar functional groups. For example, polymers from the group of the functionalized polyamines, polyurethanes, polymethacrylates alone or combinations thereof or in combination with an adipate, adipic acid and polycarboxylic acid come into consideration here. Organic acids, such as sulfonic acids and sulfonic acid esters, but also polyacrylic acid, are also suitable. Other known anionic surfactants, or a combination of various such surfactants, can also be used. Examples of surfactants having an electrosteric effect are $NaC_{1+n}H_{3+2n}SO_4$, $NaC_{1+n}H_{3+2n}SO_3$ and $NaC_{1+n}H_{3+2n}SO_3$. Examples of surfactants based on polybasic aliphatic acids and sterically acting surfactants would be sulfosuccinic acid, citric acid, trisodium citrate, sebacic acid, dodecanedioic acid and polyvinyl pyrolidone. In particular, but not exclusively, soaps based on alkali or alkaline earth salts of long-chain carboxylic acids, for example, sodium stearate, are also suitable. For non-aqueous formulations, it is possible in particular to use high molecular weight polymers having pigment-affine groups, for example, alkylolammonium salts of a copolymer having acidic groups, or else polar acidic esters of higher molecular weight alcohols.

A binding agent or binder is to be defined as a combination of one of the solvents and a particular polymer. In this combination, the solvent is, for example, terpineol, diethylene glycol, toluene or water, while the binder is typically polyvinyl butyral (PVB), polyvinyl alcohol (PVA), polypropylene carbonate or a cellulose.

Printing is to be understood here in particular as pressing, stamping, painting on, spreading out, spraying on, screen printing, lithography, automatic pipetting, in particular by means of a nanoplotter, offset printing, engraving printing, flexographic printing, inkjet printing or aerosol printing. Screen printing is preferably used. In general, printing the structure can be understood to mean the application of the paste as a gel, as a dispersion or as a suspension with a defined outer contour on the at least one contact, the contouring, that is, the shaping, of the structure being done by printing or when printing.

If a binder-free suspension or a binder-free powder is used for printing the structure, which suspension or powder is applied to the substrate, provision can be made to functionalize the suspension or the powder after application by applying pressure and/or applying mechanical friction in combination with the irradiation with electromagnetic radiation over a period in the millisecond range in order to achieve a magnetoresistive effect.

A printed magnetic functional element has a substrate having at least one contact made of an electrically conductive material and applied to a surface of the substrate. A structure made of a material having a magnetoresistive effect is printed on the at least one contact and directly touching it.

The material exhibiting a magnetoresistive effect is selected from bismuth, indium, antimony, iron, nickel, cobalt or contains an alloy of the elements mentioned or bismuth, indium, antimony, iron, nickel, cobalt or an alloy of the elements mentioned at least. In principle, said material can also be a material that does not have a ferromagnetic order. Bismuth in particular is a suitable material due to its comparatively large magnetoresistive effect.

A material from which the substrate is formed can be a glass, a semiconductor, preferably silicon, a ceramic, paper, a textile, a rubber and/or a polymer, preferably polyethylene terephthalate, polyethylene naphthalate, polyimide or polyetheretherketone or a composite material, preferably be or at least have the FR4 used for printed circuit boards (that is, the material specified in the NEMA LI1 specification). The substrate is preferably designed to be flexible, that is, preferably having a modulus of elasticity of a maximum of 10 GPa, preferably a maximum of 5 GPa, particularly preferably a maximum of 1 GPa at a temperature of 20° C. The substrate can have one or more auxiliary layers on its surface, for example, a smoothing layer and/or an intermediate adhesion layer, so that the contact or the structure does not directly touch the substrate.

In order to ensure a sufficiently high electrical conductivity, the at least one contact can be formed from or at least have an electrically conductive material, preferably silver, gold, platinum, copper, aluminum or an alloy of the elements mentioned. However, it can also be provided that the at least one contact is made from bismuth or at least has bismuth.

The substrate, the at least one contact and the printed structure can be coated or encapsulated with an organic or non-organic protective layer, such as a photoresist, a polymer, a ceramic or a glass ceramic, to protect against mechanical, chemical or thermal damage, in particular against oxidation and moisture. The polymer-based protective layer can have or contain photoresist, preferably SU-8, polymethyl methacrylate (PMMA), or polyimide (PI).

The magnetic functional element described is typically produced using the method described, that is, the method described is suitable for producing the magnetic functional element described. The method is typically suitable for printing, painting, spraying and then drying as previously described.

DESCRIPTION OF THE FIGURES

Embodiments of the invention are shown in the drawings and are explained below with reference to FIGS. 1 and 2. Shown are.

DETAILED DESCRIPTION

Figure 1:
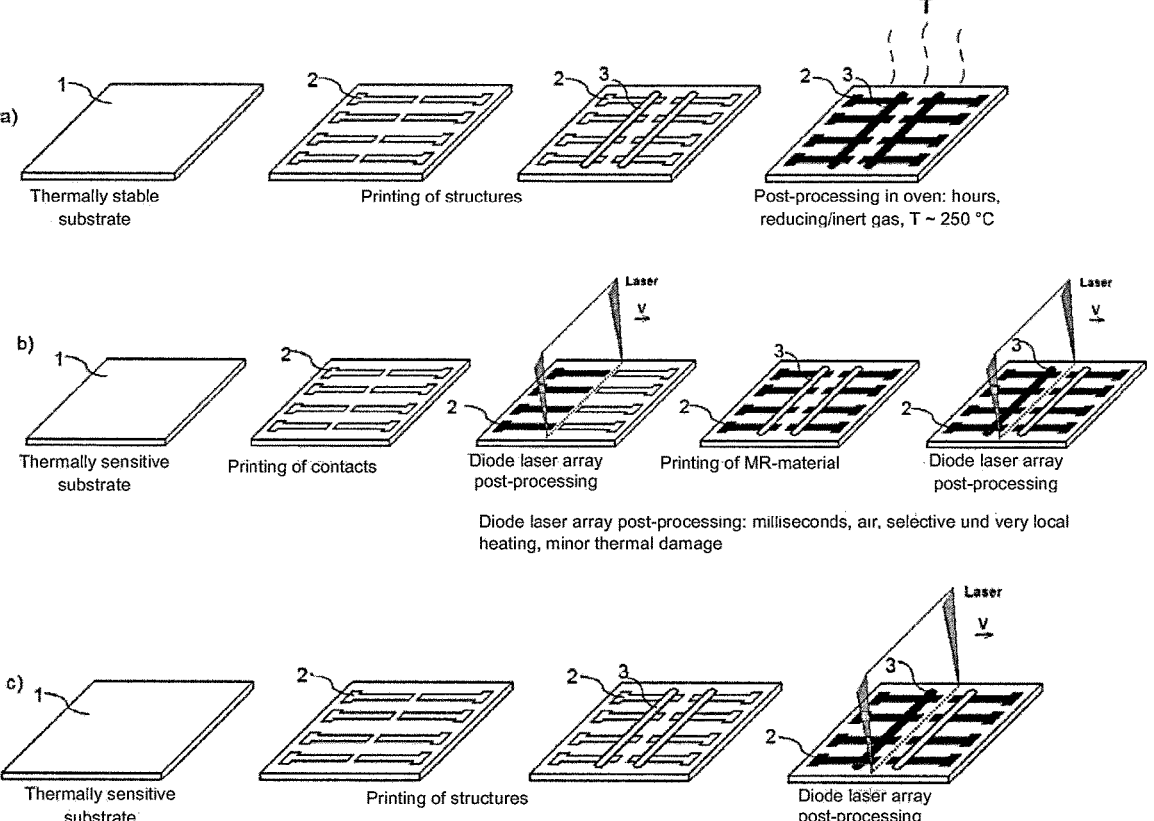
FIG. 1a one step of a schematic sequence of a production process for one embodiment of a printed magnetic functional element.
FIG. 1b another step of the schematic sequence of the production process for the printed magnetic functional element.
FIG. 1c yet another step of the schematic sequence of the production process for the printed magnetic functional element.

FIG. 1 shows a schematic view of a method for producing printed magnetic functional elements. In FIG. 1a), the upper illustration, a thermally stable substrate 1 is provided using a method known from the prior art by printing or physical or chemical vapor deposition (PVD, CVD) having a contact structure 2 made of a metal, extending over a surface of the substrate 1. A structure 3 made of a material having a magnetoresistive effect is then applied and everything is heat-treated for hours, for example, for three hours, at a temperature of around 250° C. in an inert gas atmosphere or in a vacuum.

A thermally less stable substrate 1 can also be used in the embodiment of a method according to the invention shown in FIG. 1b), the middle image. A contact structure 2 made of a metal, for example, silver, is also applied to the surface of this substrate 1. The contact structure 2 is irradiated by a diode laser array for 0.5 ms in an air atmosphere, whereby the material of the contact structure 2 is dried or sintered and becomes electrically conductive. The structure 3 made of bismuth is then printed on as a dispersion touching the contact structure 2, that is, in direct contact therewith. This structure 3 is also treated by the diode laser array for 2 ms in an air atmosphere, whereby the bismuth is functionalized and becomes electrically conductive.

In the embodiment shown in FIG. 1b), a bismuth-based structure (that is, bismuth or a bismuth alloy) having the ability to detect magnetic fields is thus produced using a wet chemical process by first producing a dispersion, paste, ink or aqueous mass using an electrically conductive or semiconducting powder. Individual materials are bismuth or bismuth alloys as described, but other metals, semiconductors, semi-metals or intermetallic alloys can also be used. The mean particle size here is between 10 nm and 100 μm, wherein a polymer-based dispersant and a binder are added to the dispersion or the like.

The thermally sensitive substrate is also used in the embodiment shown in FIG. 1c), the lower image. The contact structure 2 made of a metal, for example, silver, is applied to the surface of said substrate 1. As a next step, the structure 3 made of bismuth is then printed on as a dispersion touching the contact structure 2, that is, in direct contact therewith. The printed structures are then treated together by the diode laser array for 1 ms in an air atmosphere, whereby the two components are functionalized, that is, dried or sintered.

The bismuth is deposited or applied as a structure 3 by inkjet printing, screen printing, stencil printing or dispenser printing of said dispersion onto the rigid or flexible substrate 1, which can be formed from glass, a silicon wafer, a ceramic, a metal, a flexible polymer, paper, a textile or a rubber. Applied as a structure is intended here to mean in particular that the dispersion already structured, that is, having a defined outer contour, is applied to the substrate, so that no additional shaping layers are formed on the substrate or no subsequent shaping process steps take place. The contact structure 2 can also be printed on in the same way, but a different method can be used therefor in further exemplary embodiments.

For example, a conventional process of physical vapor deposition or chemical vapor deposition can be used to apply the contact structure 2 made of, for example, gold, platinum, silver, aluminum or copper or an alloy thereof. The contact structure 2 can be arranged below, above or next to the structure 3 and is typically designed in a two-point or four-point measurement configuration.

Bismuth is advantageous as a sensor material because it shows a large magnetoresistive effect in single crystals and in 1 μm to 20 μm thick single crystal films: At room temperature and magnetic fields up to 5 T up to 230 percent. In addition, bismuth powder is easy to obtain and produce. However, since bismuth layers do not show any electrical conductivity immediately after printing and drying without thermal post-processing, a heating process usually has to be carried out in an oven. According to the present invention, the electrical conductivity and the magnetoresistive effect can be realized faster and more reliably by irradiation with electromagnetic radiation, which also eliminates the need for a post-processing step following the thermal treatment, such as polishing, to remove organic decomposition products. Due to the irradiation in the millisecond range, a sensor produced in this way shows an isotropic sensitivity and a magnetoresistive effect in the range of approx. 4-6 percent at a magnetic field strength of 500 mT, which can probably be increased to more than 8 percent through optimization.

A functionalization of the structure 3, which enables the occurrence of electrical conductivity and magnetoresistive functionality, takes place by thermal treatment in air over a period in the millisecond range, during which drying also takes place. In further embodiments, this can also take place in a vacuum or in an inert gas atmosphere. A conventional laser, a diode laser, a micro-optically optimized diode laser array or a flash lamp can be used for thermal treatment over a period of time in the millisecond range. This means that a plurality of materials or combinations of materials can also be used.

Finally, the substrate 1 with the contact structure 2 and the structure 3 can be provided with an encapsulation in order to make the entire system less sensitive to harsh or aggressive media and moisture. In conclusion, the produced sensor can be processed as a magnetic functional element by static or alternating magnetic fields in order to remove offsets and hysteresis effects. The sensor shows good temperature stability in air up to approximately 125° C. after this encapsulation.

Figure 2:
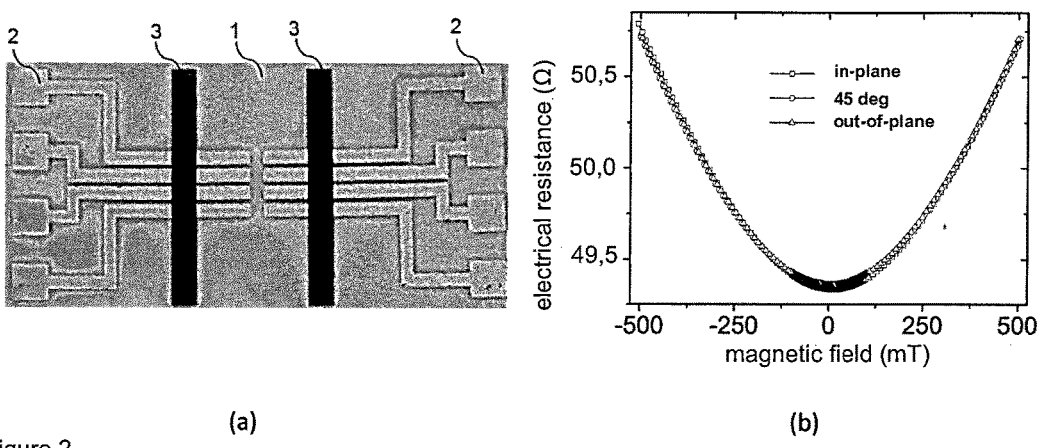
FIG. 2a a plan view of a printed magnetic functional element as produced.
FIG. 2b a measured value diagram of the printed magnetic functional element as produced.

In FIG. 2a) (the left half of FIG. 2), an embodiment of a correspondingly produced functional element in four-point measurement geometry is shown in a plan view. In this figure, recurring features are provided with the same reference numerals as in FIG. 1. FIG. 2b) shows a diagram of the course of the electrical resistance in the configuration shown in FIG. 2a) with a change in the applied magnetic field. Measured values are shown for the magnetic field direction in the sample plane (in-plane), perpendicular to the sample plane (out-of-plane) and at an angle of 45°.

The printed magnetic functional element described can register various types of movement such as displacement, rotation or vibration. Position sensors or angle sensors can be implemented accordingly. Alternatively or additionally, magnetic switches can also be built with the printed magnetic functional element or magnetic field sensor.

Features of the various embodiments that are only disclosed in the exemplary embodiments can be combined with one another and claimed individually.

The invention claimed is:

1. A method for producing a printed magnetic functional element, comprising:

a substrate is provided on a surface having at least one contact made of an electrically conductive material, a structure arranged below, above or next to the contact and made of a material in the form of a powder with a mean particle size of between 100 nm and 10 μm having a magnetoresistive effect is printed as a paste, gel, dispersion or suspension on or onto the at least one contact and directly touching it, and subsequently the contact and/or the structure is functionalized by irradiation with electromagnetic radiation over a period of time in the millisecond range and becomes electrically conductive and sensitive to magnetic fields at least by forming a mechanical connection between individual particles of the electrically conductive material and/or the one magnetoresistive effect material, wherein the material exhibiting a magnetoresistive effect is selected from bismuth, indium, antimony, nickel, or an alloy of the elements mentioned, or at least contains bismuth, indium, antimony, nickel, or an alloy of the elements mentioned, wherein the period of time in the millisecond range is between 0.1 ms and 100 ms.

2. The method according to claim 1, wherein the irradiation with electromagnetic radiation is carried out with a laser radiation, comprising diode laser radiation, and/or an irradiation using a flash lamp.

3. The method according to claim 1, wherein the at least one contact made of an electrically conductive material is applied by at least one printing process, a gas phase deposition or a lamination of the contact.

4. The method according to claim 1, wherein when printing the structure, a gel, a paste, a dispersion or a suspension of a powder containing at least one metallic, semi-metallic or semiconducting material, a dispersant containing a polymer and/or a binder is produced, wherein an average particle size of the powder containing metallic, semi-metallic or semiconducting material is between 10 nm and 100 μm.

5. The method according to claim 4, wherein a binder-free suspension or a binder-free powder is used for printing the structure, which suspension or powder is applied to the substrate and is subsequently activated by the application of pressure and/or friction in combination with the irradiation with electromagnetic radiation over a period of time in the millisecond range in order to achieve a magnetoresistive effect.

6. The method according to claim 1, wherein the period of time in the millisecond range is between 0.5 ms and 2 ms.

*     *     *     *     *